United States Patent
Yamazaki et al.

[11] Patent Number: 5,880,038
[45] Date of Patent: Mar. 9, 1999

[54] METHOD FOR PRODUCING SEMICONDUCTOR DEVICE

[75] Inventors: Shunpei Yamazaki, Tokyo; Toshimitsu Konuma; Yasuhiko Takemura, both of Kanagawa, all of Japan

[73] Assignee: Semiconductor Energy Laboratory Co., Ltd., Kanagawa-ken, Japan

[21] Appl. No.: 612,191

[22] Filed: Mar. 7, 1996

[30] Foreign Application Priority Data

Mar. 7, 1995 [JP] Japan .................................. 7-074403

[51] Int. Cl.⁶ .................................................. H01L 21/00
[52] U.S. Cl. ........................ 438/756; 216/101; 438/743
[58] Field of Search ........................... 156/643.1, 644.1, 156/657.1, 659.11; 216/56, 101; 438/743, 756, 694; 437/40, 187, 194, 235

[56] References Cited

U.S. PATENT DOCUMENTS

| | | | |
|---|---|---|---|
| 5,146,301 | 9/1992 | Yamamura et al. | 349/152 |
| 5,359,206 | 10/1994 | Yamamoto et al. | 257/59 |
| 5,422,239 | 6/1995 | Konya | 437/50 |
| 5,576,225 | 11/1996 | Zhang et al. | 437/21 |
| 5,580,800 | 12/1996 | Zhang et al. | 437/194 |
| 5,581,382 | 12/1996 | Kim | 349/149 |
| 5,648,826 | 7/1997 | Song et al. | 349/139 |

FOREIGN PATENT DOCUMENTS

| | | | |
|---|---|---|---|
| 2-210420 | 8/1990 | Japan . | |
| 2-216129 | 8/1990 | Japan . | |
| 2-232628 | 9/1990 | Japan | 349/149 |

*Primary Examiner*—William Powell
*Attorney, Agent, or Firm*—Fish & Richardson P.C.

[57] ABSTRACT

After a resist mask is selectivity formed on an upper portion of a gate electrode containing mainly aluminum. At this state an anodization process is performed using an electrolytic solution, to form an anodic oxide film in a region other than a region of the upper portion on which the resist mask is formed. A silicon oxide film is formed to cover the gate electrode or the like Since an anodic oxide film is not formed on the region of the upper portion, contact holes for a wiring or an electrode made of aluminum are formed by etching the silicon oxide film using a hydrofluoric acid system etchant.

23 Claims, 5 Drawing Sheets

P ION IMPLANTATION

METHOD FOR PRODUCING SEMICONDUCTOR DEVICE

BACKGROUND OF THE INVENTION

1. Field of the Invention

The present invention relates to a method for forming a contact for an electrode or a wiring containing aluminum or mainly aluminum.

2. Description of the Related Art

A thin film transistor (TFT) produced in a producing process as shown in FIGS. 2A to 2D has been known. The TFT as shown in FIGS. 2A to 2D is formed on a glass substrate and has a low OFF current characteristic. The low OFF current is an important factor in a case wherein the TFT is utilized for an active matrix type liquid crystal display device or other thin film integrated circuit.

The TFT of FIGS. 2A to 2D has an electrically buffer region which is offset gate regions formed between a channel forming region and source/drain regions, to improve an OFF current characteristic. The structure of FIGS. 2A to 2E is disclosed in Japanese Patent Application Open No. 4-360580, for example.

A process for producing the TFT of FIG. 2D is described below. A glass substrate 201 is prepared and then a silicon oxide film 202 is formed on a surface of the substrate 201 by sputtering or plasma chemical vapor deposition (plasma CVD). The silicon oxide film 202 is a base film for preventing diffusion of an impurity and the like from the glass substrate 201. An amorphous silicon film is formed by plasma CVD or low pressure thermal CVD. If necessary, heating treatment or laser light irradiation is performed to crystallize the amorphous silicon film. If a low characteristic is permitted, it is not necessary to crystallize the amorphous silicon film.

The amorphous silicon film is patterned to form an active layer 203 of a TFT. Then, a silicon oxide film 204 used as a gate insulating film is formed by plasma CVD or sputtering. Also, an aluminum film is formed and then patterned to form a gate electrode 205. (FIG. 2A)

Using an electrolytic solution, anodization is performed with the gate electrode 205 as an anode, to form an anodic oxide film 206 around the gate electrode 205. In the TFT of FIG. 2D, a method for forming the anodic oxide film 206 is an important point. (FIG. 2B)

In FIG. 2C, an impurity ion (phosphorus (P) ion) used to form source and drain regions is implanted by ion implantation or plasma doping. In this process, since the gate electrode 205 and the anodic oxide film formed around the gate electrode 205 are used as masks, the impurity ion is not implanted into a region under the masks. Thus, a source region 207 and a drain region 210 can be formed. A region 208 into which the impurity ion is not implanted can be formed as an offset gate region. A region 209 can be formed as a channel forming region.

Since this impurity ion implantation process of FIG. 2C can be performed in a self-alignment, a complicated process such as a mask alignment is not required, extremely high productivity can be obtained and dispersion elements having no dispersion in characteristic can be obtained.

After the ion implantation process of FIG. 2C, a silicon oxide film 211 is formed as an interlayer insulating film. Also, contact holes are formed and then a source electrode 212 and a drain electrode 213 are formed. At the same time, a lead electrode 214 from the gate electrode 205 is formed. In FIG. 2D, although the source and drain regions 212 and 213 and the lead electrode 214 from the gate electrode 205 are shown each other in the same cross section, the lead electrode 214 from the gate electrode 205 is formed in a front side or an opposite side of the figure, actually.

The TFT produced by the process of FIGS. 2A to 2D has good characteristic and a superior offset gate region. Also, in an active matrix type liquid crystal display device having a large display area and other large scale integrated circuit, it is extremely effective to use aluminum in a gate electrode since a wiring resistance is decreased. In particular, in a case of an insulated gate type field effect transistor which is voltage-controlled, this is very important. In the structure of FIG. 2D, since a gate electrode and a wiring are covered with a fine anodic oxide film having a high withstanding voltage, the problems with respect to a leak or an interaction to various wirings formed on an interlayer insulating film can be solved.

Although the TFT of FIG. 2D is utilized, an extremely difficult state occurs in the process of FIG. 2D. In the process of FIG. 2D, it is required that contact holes for source and drain electrodes 212 and 213 and a contact hole for the lead electrode 214 from the gate electrode 205 are formed at the same time.

Since a removing film is the silicon oxide films 204 and 211, the contact holes for the source and drain regions 212 and 213 are formed by wet etching using a hydrofluoric acid system etchant, for example, buffer hydrofluoric acid (BHF). With respect to the buffer hydrofluoric acid, an etching rate to silicon is markedly smaller than that to silicon oxide. Thus, etching can be completed at a state wherein etching reaches the active layer 203. That is, the active layer 203 can be used as an etching stopper.

However, when the contact hole for the lead electrode 214 is formed, it is necessary to etch the silicon oxide film 211 and the aluminum oxide layer (containing mainly $Al_2O_3$) 206 formed by anodization. When this etching is performed using the buffer hydrofluoric acid, It has confirmed that it is difficult to complete etching at the time when the aluminum oxide layer 206 is etched completely. This is a cause that etching of the aluminum oxide layer 206 by a hydrofluoric acid system etchant does not progress uniformly, but it progresses while crumbling easily. This is because, etching of aluminum does not progress after etching of the aluminum oxide layer 206, but etching to the gate electrode 205 of aluminum progresses by a permeated etchant at the same time during etching of the aluminum oxide layer 206. Also, this is a common problem in a case wherein a hydrofluoric acid system etchant is used.

A state that the oxide layer 206 is etched by the hydrofluoric acid system etchant is shown in FIGS. 3A and 3B. In FIG. 3A, the silicon oxide film 211 is etched by the hydrofluoric acid system etchant (for example, buffer hydrofluoric acid). Then, the aluminum oxide layer 206 is etched. In this state, the gate electrode 205 made of aluminum is also etched while the oxide layer 206 is etched.

A thickness of the oxide layer 206 is about 2000 Å, and a thickness of the gate electrode 205 is about 4000 to 7000 Å. Generally, an etching speed (etching rate) of the aluminum oxide layer 206 is several 10% larger than that of aluminum. Also, the oxide layer 206 is not etched uniformly and finely and but it is removed by crumbling. When the oxide layer 206 is etched completely, overetching as shown in numeral 302 occurs. Thus, the remainders of the oxide layer 206 and the silicon oxide film 211 in an upper portion of an overetched portion 302 may be caved. This can be just understood as the same phenomenon as a process using a lift off method, and is a cause of insufficient operation of a TFT.

SUMMARY OF THE INVENTION

In order to solve the above problems, A method for etching the aluminum oxide layer 206 by changing an etchant into chromic mixed acid in a state that the silicon oxide film 211 is removed has developed by the present inventors. Etching of the silicon oxide film 211 using the hydrofluoric acid system etchant, in particular, buffer hydrofluoric acid has high reproducibility and can be estimated quantitatively. Thus, when the aluminum oxide layer 206 is exposed, changing of the etchant is relatively easy.

The chromic mixed acid is obtained by adding chromic acid to a solution containing phosphoric acid, acetic acid and nitric acid. Since this chromic mixed acid does not almost etch aluminum, only the aluminum oxide layer can be etched selectively. That is, the gate electrode 205 of aluminum can be utilized as an etching stopper.

However, there is a new problem in this state. In the chromic mixed acid, composition change occurred by the use for etching is large, a desired etching effect is changed whenever a process is repeated. Since this is a cause of inferior of a producing element and dispersion of characteristic, it is not preferable.

When the aluminum oxide layer 206 is removed using the chronic mixed acid, a passive film is formed on a surface of the exposed gate electrode 205 of aluminum. Since the passive film is formed, etching to the gate electrode containing mainly aluminum does not progress. However, since the passive film has a high resistance, it blocks electrical contact between the lead electrode (214 in FIG. 2D) and the gate electrode 205.

To solve this, it is necessary to remove the passive film using the hydrofluoric acid system etchant. However, etching using the hydrofluoric acid system etchant to the gate electrode 205 may progresses at the same state as shown in FIG. 3B. Also, the passive film is an extremely thin and thus fine etching process is required. Therefore, since reproducibility of a process is obtained and there is a problem in productivity.

Although it is considered that the aluminum oxide layer 206 is etched by dry etching, there is no method for selectively dry-etching the aluminum oxide film 206 in good reproducibility.

As described above, a method for forming an oxide layer around a gate electrode made of aluminum by anodization and forming offset gate regions in a self-alignment in an ion implantation process using the oxide layer of aluminum as a mask is superior. However, there is a problem in a producing process that it is difficult to form a contact hole by etching the aluminum oxide layer.

The object of the present invention disclosed in the specification is to solve the above problem. Also, the object of the present invention disclosed in the specification is to provide a method for forming easily a contact electrode or wiring to an aluminum electrode or wiring around which the aluminum oxide layer is formed, at high reproducibility.

The present invention disclosed in the specification is characterized in that a method includes the steps of, forming a wiring or an electrode containing aluminum or mainly aluminum, forming a mask on a portion of the wiring or the electrode, and forming an anodic oxide film on a surface of the wiring or the electrode other than the portion on which the mask is formed, by anodizing the wiring or the electrode as an anode in an electrolytic solution.

In the above structure, the phrase "containing mainly aluminum" represents a case wherein various elements are contained in the aluminum. For example, in a heating treatment process and the like performed in a producing process of a semiconductor element, there is a method for including at about 0.1 to 1% a rare-earth element such as silicon and scandium in aluminum so as not to occur an am abnormal growth of aluminum. In this method, a material containing mainly aluminum is used.

FIGS. 1A to 1E show an example in a case wherein the above structure is utilized, that is, a process for producing a TFT formed on a glass substrate. In a process of FIG. 1A, a gate electrode 105 is formed using aluminum containing scandium. A resist mask 106 is formed in a process of FIG. 1B, and an anodic oxide film 107 is formed in a region other than a portion by anodization in an electrolytic solution in a process of FIG. 1C.

Also, the present invention is characterized in that a method includes the steps of, forming a wiring or an electrode containing aluminum or mainly aluminum, forming a mask on a portion of the wiring or the electrode, forming an anodic oxide film on a surface of the wiring or the electrode other than the portion on which the mask is formed, by anodizing the wiring or the electrode as an anode in an electrolytic solution, forming a silicon oxide film to cover the wiring or the electrode, and etching the silicon oxide film using hydrofluoric acid system etchant to form a contact hole for the wiring or the electrode.

In the above structure, as the hydrofluoric acid system etchant, hydrofluoric acid, buffer hydrofluoric acid (BHF), hydrofluoric acid or buffer hydrofluoric acid to which acetic acid is added, and the hydrofluoric acid system etchant to which surface-active agent is added, can be used. The buffer hydrofluoric acid can be obtained mixing ammonium fluoride with hydrofluoric acid at 10:1. In the hydrofluoric acid system etchant, since an etching rate of silicon oxide and aluminum is remarkedly large in comparison with that of silicon, this is a utilizing etchant in a case wherein a material made of silicon oxide or aluminum (or a material containing mainly these materials) is removed selectively or a contact hole is formed in these materials.

Further, the present invention is characterized in that a method includes the steps of, forming an insulating film on a semiconductor, forming a wiring or an electrode containing aluminum or mainly aluminum on the insulating film, forming a mask on a portion of the wiring or the electrode, forming an anodic oxide film on a surface of the wiring or the electrode other than the portion on which the mask is formed, by anodizing the wiring or the electrode as an anode in an electrolytic solution, removing the mask, forming an insulating film to cover the wiring or the electrode, and forming a contact hole for the semiconductor and a contact hole for the wiring or the electrode at the same time.

An example of the above structure is shown in FIGS. 1A to 1E. In FIG. 1A, an insulating film (gate insulating film) 104 which is a silicon oxide film is formed on a semiconductor (silicon semiconductor) 103 constructing an active layer of a TFT. The active layer represents source and drain regions, a channel forming region, a portion in which a lightly doped drain (LDD) region and an offset gate region are formed.

In FIG. 1A, a gate electrode 105 containing mainly aluminum is formed on the insulating film 104. In FIG. 1B, a resist mask 106 is formed on the gate electrode 105. In FIG. 1C, an anodic oxide film 107 is formed in a region other than a portion of the gate electrode 105 on which the resist mask 106 is formed.

After removing the resist mask, a silicon oxide film 112 is formed as an interlayer insulating film, and then a contact hole 113 for a source region 108, a contact hole 114 for a drain region 111 and a contact hole 115 for the gate electrode 105 are formed using the hydrofluoric acid system etchant at the same time.

Furthermore, the present invention is characterized in that a method includes the steps of, forming a wiring or an electrode containing aluminum or mainly aluminum, forming an anodic oxide film on a surface of the wiring or the electrode other than the portion on which the mask is formed, by anodizing the wiring or the electrode as an anode in an electrolytic solution, and forming a contact electrode in the desired region of the wiring or the electrode.

When an anodic oxide film is formed on surfaces of a wiring and an electrode containing aluminum or mainly aluminum by an anodization process, a mask is formed on a portion of the wiring and the electrode so as not to anodize selectively the portion of the wiring and the electrode, so that contact holes for the wiring and the electrode can be formed easily. Also, productivity and yield of a semiconductor device having a structure that the anodic oxide film is formed on the surfaces of the wiring and the gate electrode containing aluminum or mainly aluminum can be improved remarkedly.

DETAILED DESCRIPTION OF THE PREFERRED EMBODIMENTS

[Embodiment 1]

The embodiment is characterized in that in a thin film transistor (TFT) having a gate electrode containing mainly aluminum, a portion of the gate electrode is not formed on an anodic oxide film, this portion is utilized as a contact portion for the gate electrode.

FIG. 1A to 1E shows a producing process of the embodiment. In the embodiment, a glass substrate 101 is Corning 7059 glass substrate or Corning 1737 glass substrate. A silicon oxide film 102 having a thickness of 3000 Å is formed as a base film on a glass substrate 101. Also, By plasma chemical vapor deposition (plasma CVD) or low pressure thermal CVD, an amorphous silicon film 103 having a thickness of 500 Å is formed. The amorphous silicon film is crystallized by laser light irradiation to obtain a crystalline silicon film. The obtained crystalline silicon film is patterned to obtain an active layer 103.

Figure 1A:
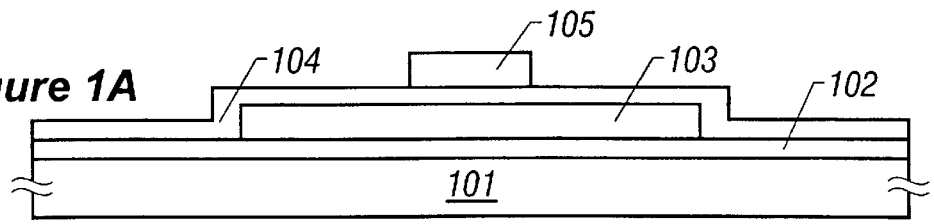
FIGS. 1A to 1E show a producing process of a TFT according to an embodiment.

After obtaining the active layer 103, a silicon oxide film 104 serving as a gate insulating film is formed at a thickness of 1000 Å by plasma CVD. Also, an aluminum film containing scandium at 0.1 weight % is formed at a thickness of 6000 Å by sputtering and electron beam evaporation and then patterned to form a gate electrode 105 containing mainly aluminum. (FIG. 1A)

Figure 1B:
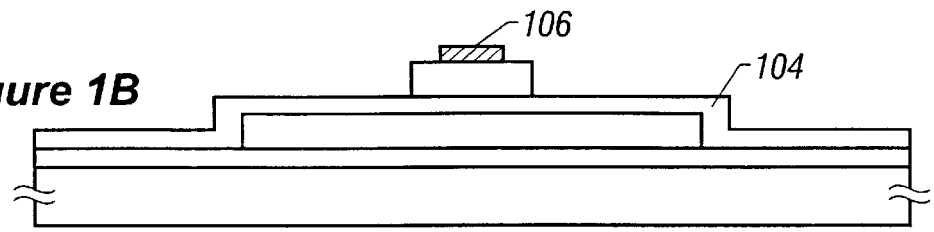

A resist mask 106 is formed on the gate electrode 105. A region on which the resist mask is formed is a region in which a contact hole for the gate electrode is to be formed in a later process. (FIG. 1B)

After the resist mask is 106 formed, an oxide layer 107 of a material containing mainly aluminum is formed by anodization in an electrolytic solution. A thickness of the oxide layer 107 is set to be 2000 Å. The electrolytic solution used in this process is an ethylene glycol solution which is pH-adjusted by using ammonia. In this anodization process, a region of the gate electrode 105 which is in contact with the resist mask 106 is not in contact with the electrolytic solution, so that oxidation doe not progress and the oxide layer is not formed.

Figure 1C:
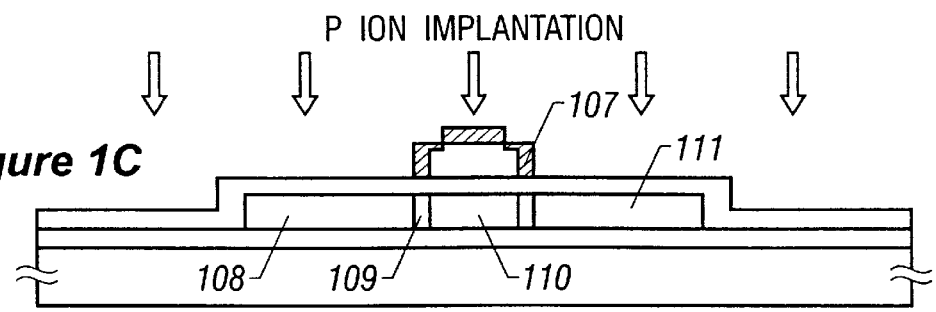

After the anodization process is completed, the resist mask 106 is removed. An impurity ion is implanted into the active layer 103 to form source and drain regions. In this embodiment, a phosphorus (P) ion is implanted by plasma doping to produce an N-channel type TFT. (FIG. 1C)

By the P ion implantation, a source region 108 and a drain region 111 are formed. At the same time a channel forming region 110 and offset gate regions 109 are formed.

A silicon oxide film 112 having a thickness of 7000 Å is formed as an interlayer insulating film by plasma CVD using a tetraethoxysilane (TEOS) gas. Contact holes 113 and 114 for the source and drain regions 108 and 111 and a contact hole 115 for the gate electrode 105 are formed by wet etching using an etchant that acetic acid is added to buffer hydrofluoric acid. In this process, when etching of the silicon oxide film 112 is completed, etching of the silicon oxide film 104 is started in the contact holes 113 and 114 and etching of the gate electrode 105 containing mainly aluminum is started in the contact hole 115.

Figure 3A:
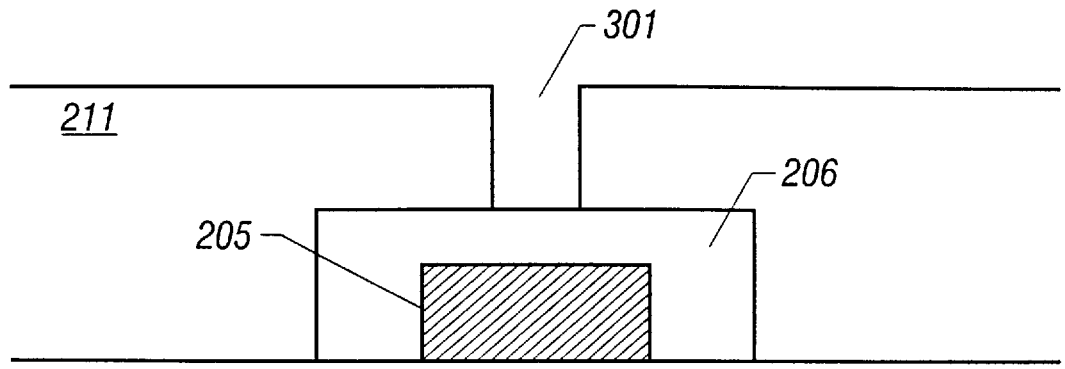
FIGS. 3A and 3B show a state of a conventional contact hole formation for a gate electrode.
Figure 3B:
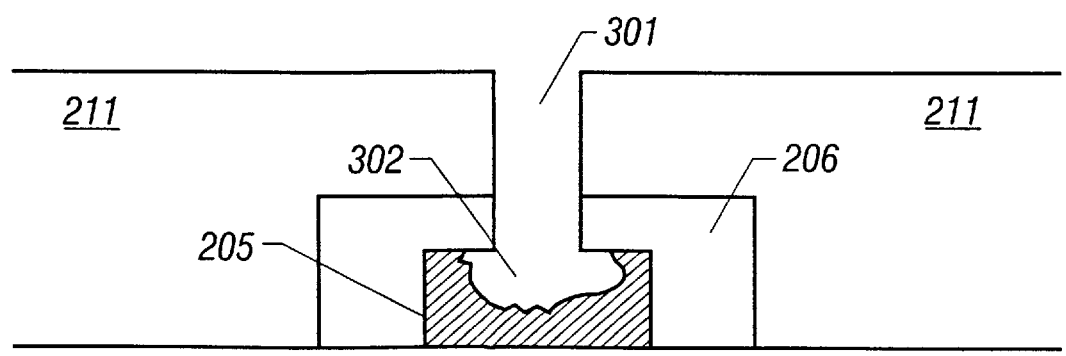

According to the measurement, an etching speed of aluminum by buffer hydrofluoric acid is about half of etching speed of the silicon oxide film. A thickness of the silicon oxide film 104 is about 1000 ÅA, and a thickness of the gate electrode 105 is generally 4000 Å or more. Thus, by the above process, in a state that the contact holes 113 and 114 are formed by etching the silicon oxide film 104, a state that only a part of the upper portion of the gate electrode 105 is etched is obtained. Therefore, the state as shown in FIG. 3B is not obtained with respect to etching of the gate electrode 105.

Figure 1D:
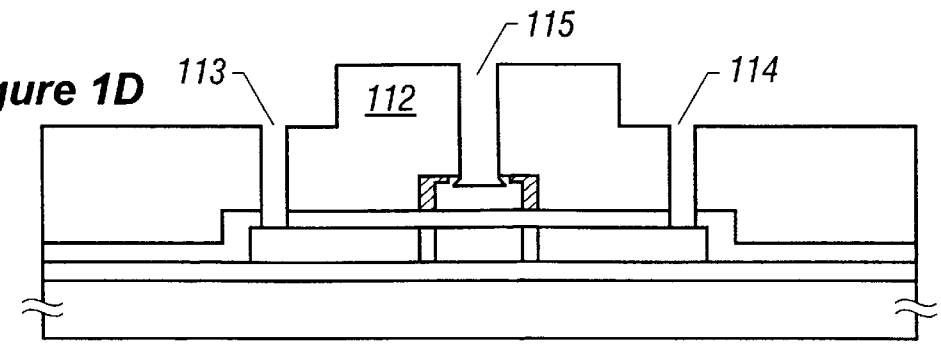

This etching process is completed when the surface of the active layer 103 is exposed, in accordance with the etching rate of silicon oxide. Thus, the contact hole 113 and 114 for the source and drain regions 108 and 111 and the contact hole 115 for the gate electrode 105 are formed at the same time. (FIG. 1D)

There is no problem with respect to operation (drive) of a TFT even if positioning is shifted to some extent in the formation of the contact hole 115. Thus, an error in the producing process can be permitted within a desired range. This is because, since a current does not almost flow into the gate electrode 105, even if a contact area between the gate electrode 105 and the lead electrode therefrom become small somewhat, no problem almost occurs.

A laminate film of a titanium film and an aluminum film is formed and then patterned to form a source electrode (or a source wiring) 116, a drain electrode (or a drain wiring) 117 and a gate wiring (a lead electrode) 118.

Figure 1E:
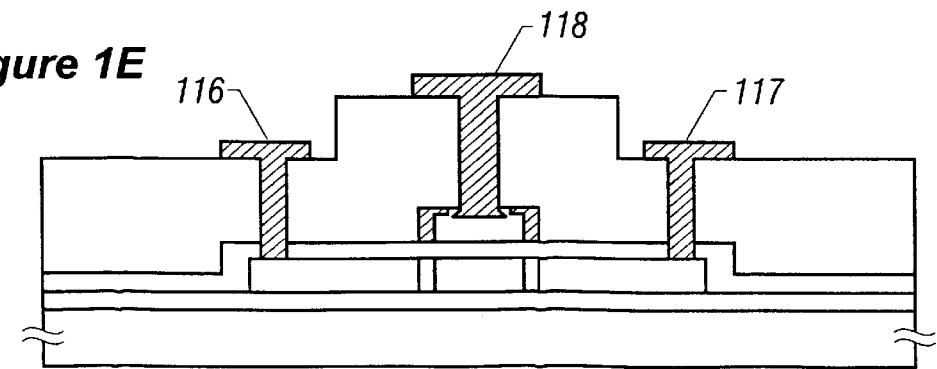
Figure 2A:
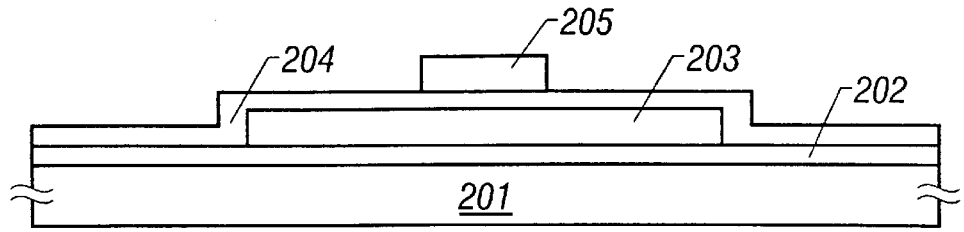
FIGS. 2A to 2D show a conventional producing process of a TFT.
Figure 2B:
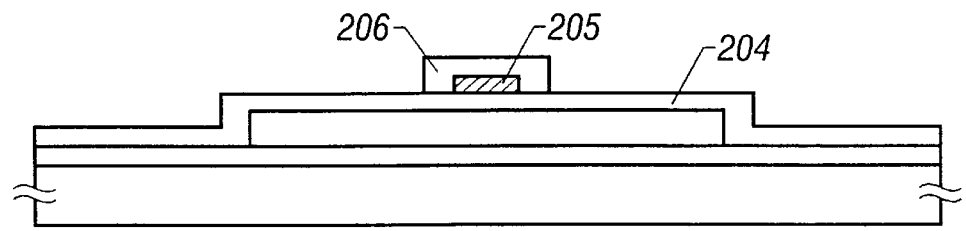
Figure 2C:
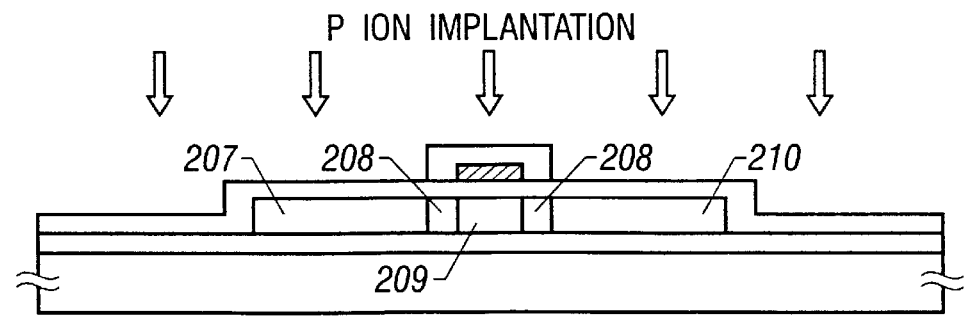
Figure 2D:
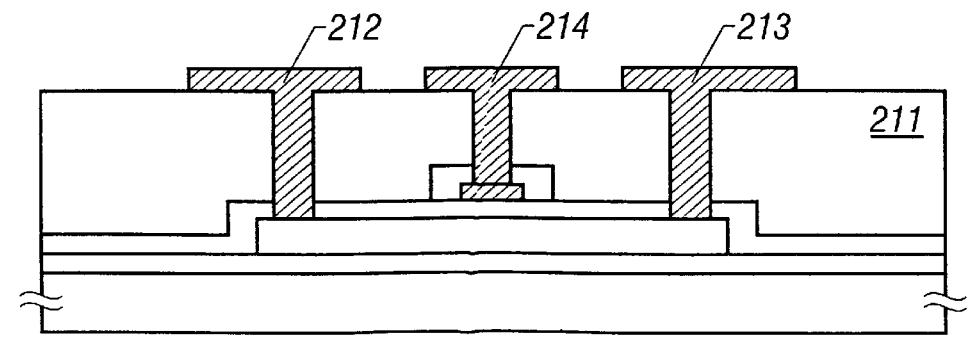

Finally, heating treatment is performed for 1 hour in an atmosphere containing hydrogen at 350° C., so that a TFT as shown in FIG. 1E is completed.

[Embodiment 2]

The embodiment relates to a TFT having an extremely superior OFF current characteristic with which a lightly doped drain region and an offset gate region are formed. FIGS. 4A to 4D shows a producing process of the embodiment.

A silicon oxide film 402 having a thickness of 3000 Å is formed as a base film on a glass substrate 401. Also, By plasma CVD or low pressure thermal CVD, an amorphous silicon film having a thickness of 500 Å is formed. The amorphous silicon film is crystallized by a desired method such as laser light irradiation to obtain a crystalline silicon film. The obtained crystalline silicon film is patterned to form an active layer 403 of a TFT.

A silicon oxide film 404 used as a gate insulating film is formed at a thickness of 1000 Å by plasma CVD. Also, a film including mainly aluminum containing scandium at 0.1 to 0.3 weight % is formed by sputtering and electron beam evaporation. Then, an anodization process is performed in an ethylene glycol solution containing 3 to 10 % of tartaric acid, boric acid or nitric acid, to form an extremely thin anodic oxide film 406 of a barrier type on a surface of the film containing mainly aluminum, by applying a voltage to the film containing mainly aluminum. The barrier type anodic oxide film 406 has a fine structure.

Figure 4A:
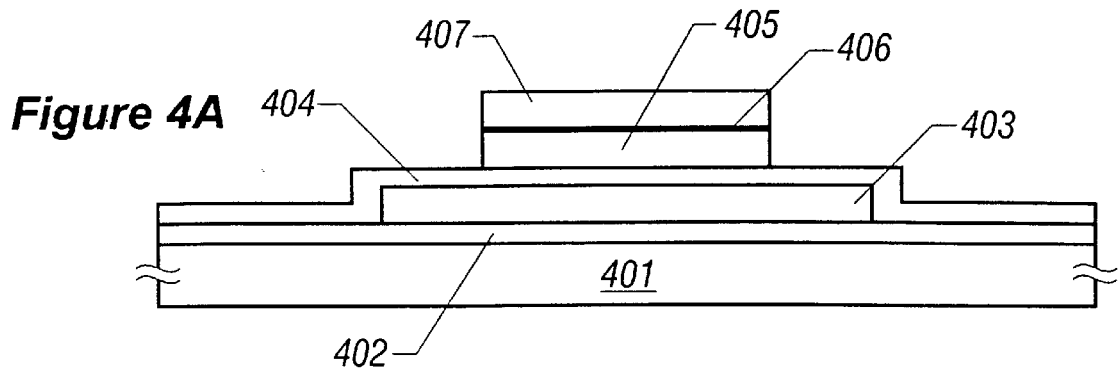
FIGS. 4A to 4D show a producing process of a TFT according to an embodiment.

A mask 407 constructed by a photoresist is formed, and then an exposed portion of the film containing mainly aluminum is etched to obtain a state as shown in FIG. 4A. In FIG. 4A, a portion 405 is obtained by patterning the film containing mainly aluminum and a portion constructing a gate electrode portion.

Figure 4B:
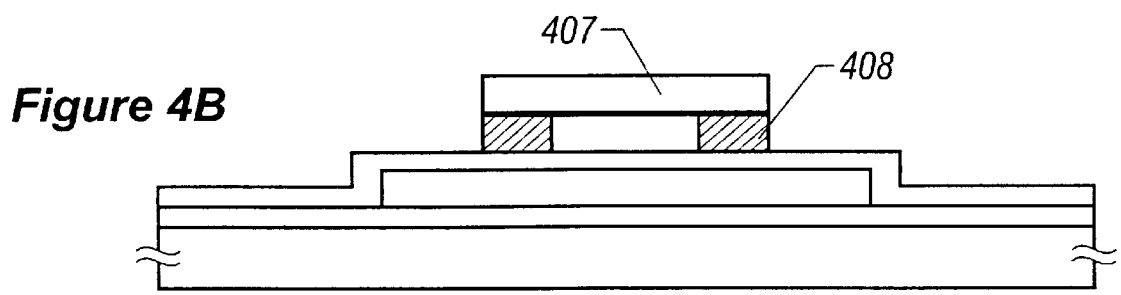

After obtaining the state of FIG. 4A, an anodization process is performed again in an acid aqueous solution containing 3 to 20% of citric acid, phosphoric acid, nitric acid, chromic acid or sulfuric acid. In this process, a voltage of 10 to 30V is applied to the portion (film) 405. An anodic oxide film formed in this process is porous. Since the barrier type anodic oxide film 406 and the resist mask 407 are formed on an upper surface of the film 405 containing mainly aluminum, the upper surface of the film 405 is not in contact with an electrolytic solution, so that anodization does not progress. Thus, as shown in FIG. 4B, a portion 408 is anodized and then becomes aluminum oxide.

Figure 4C:
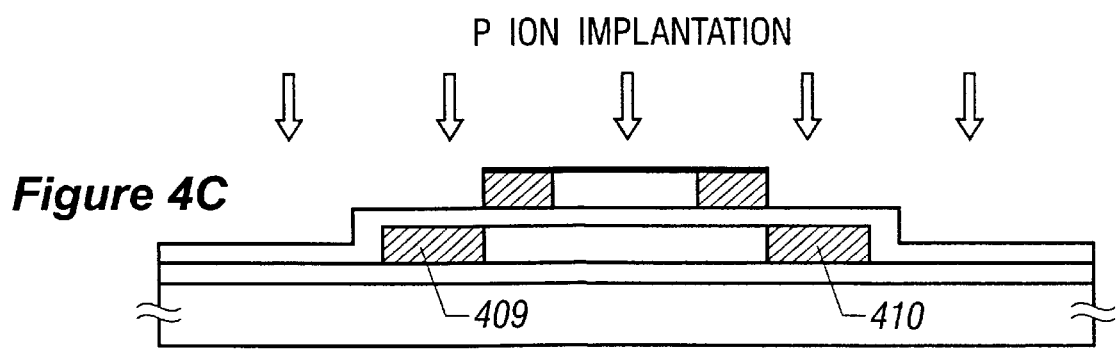

After the resist mask 407 is removed, an impurity ion is implanted to form source and drain regions. In this embodiment, a phosphorus (P) ion is implanted by plasma doping to produce an N-channel type TFT. A dose is $5\times10^{14}$ to $5\times10^{15}$ cm$^{-2}$. By this process, regions 409 and 410 become an N-type and thus are used as source and drain regions. (FIG. 4C)

Using a phosphoric acid system etchant, the porous oxide layer 408 is etched. The phosphoric acid system etchant can be obtained by using a mixed acid of phosphoric acid, acetic acid and nitric acid, for example. When the phosphoric acid system etchant is used, the porous oxide layer can be selectively etched (removed).

Figure 4D:
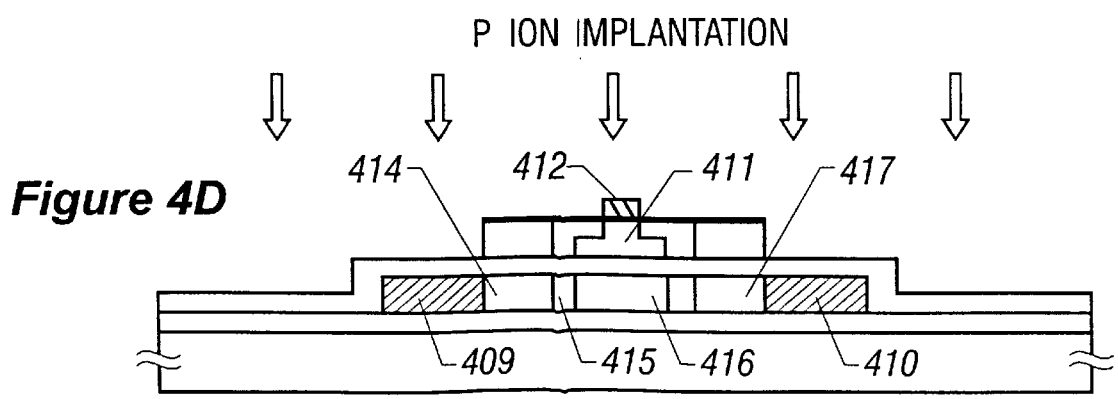

In FIG. 4D, a gate electrode 411 containing mainly aluminum is formed, and then a resist mask 412 is formed in a portion in which a contact for the gate electrode 411 is to be formed.

Again, an anodization process is performed using the same electrolytic solution as in the formation of the fine oxide layer 406 by applying a voltage of 150 to 200V to the gate electrode 411, so that an anodic oxide film 413 is formed. A thickness of the anodic oxide film 413 is about 2000 Å. The anodic oxide film 413 formed in this process has a barrier type fine structure and the same property as the extremely thin oxide layer 406.

Also, in the state of FIG. 4D, a P ion implantation is performed again. A dose in this state is one or two order lower than that in the state of FIG. 4C. Thus, regions 414 and 417 can be used as lightly doped drain regions. Since the oxide layer 413 formed on the anodization process is used as a mask, offset gate regions 415 are formed. A region 416 is formed as a channel forming region.

As a result, the structure including the source region 409, the drain region 410, the lightly doped drain regions 414 and 417, the channel forming region 416 and the offset gate regions 415 can be obtained. (FIG. 4D)

Figure 5A:
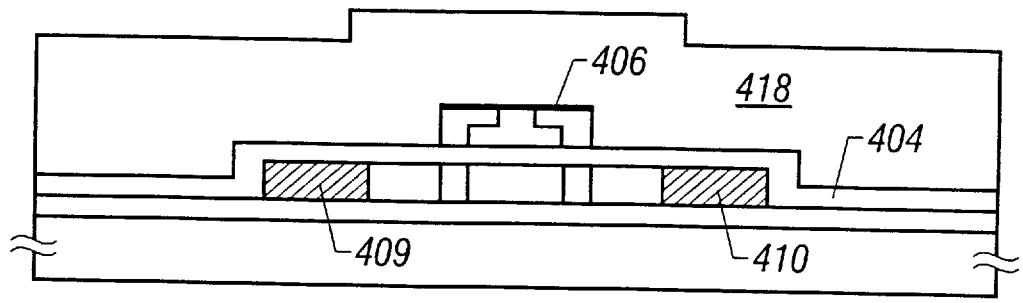
FIGS. 5A and 5B show a producing process of a TFT according to an embodiment.

As shown in FIG. 5A, a silicon oxide film 418 having a thickness of 6000 Å is formed as an interlayer insulating film by plasma CVD using a tetraethoxysilane (TEOS) gas. Contact holes for the source and drain regions 409 and 410 and a contact hole for the gate electrode 411 are formed by using a hydrofluoric acid system etchant, in this example, buffer hydrofluoric acid containing acetic acid.

In etching for the formation of contact holes, the silicon oxide film 418 is etched first. The silicon oxide film 418 has substantially the same thickness as in all portion thereof. Thus, When the gate electrode 411 containing mainly aluminum is exposed, the gate insulating film 404 formed on the source and drain regions 409 and 410 is exposed. Although the extremely thin anodic oxide film 406 of the barrier type (having a film thickness of about 100 to 150 521 in theoretical calculation) is formed, There is no problem in the anodic oxide film 406 having such the thickness.

Then, while the silicon oxide film 404 formed on the source and drain regions 409 and 410 is etched, etching to the gate electrode 411 progresses. A thickness of the silicon oxide film 404 is about 1000 Å (generally, about 1500 Å in maximum), and a thickness of the silicon oxide film 418 used as an interlayer insulating film is about 6000 Å (generally, about 4000 Å in minimum). Also, an etching rate of a hydrofluoric acid system etchant to the silicon oxide film is larger than that to the aluminum. Thus, if etching is stopped at the time when the source and drain regions 409 and 410 are exposed, the gate electrode containing mainly aluminum does not receive large damage due to etching. That is, in such a case, since only a portion of the gate electrode 411 is etched, a cause with respect to insufficient operation of an element does not occur.

Figure 5B:
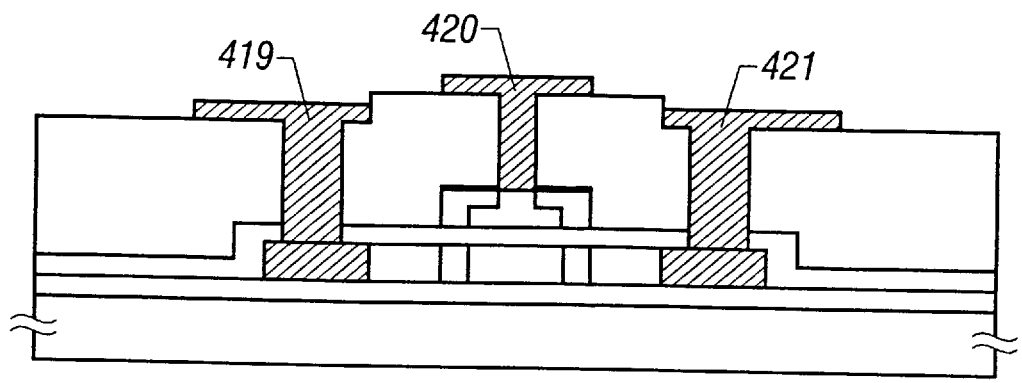

Finally, heating treatment is performed for 1 hour in an atmosphere containing hydrogen at 350° C., so that a TFT as shown in FIG. 5B is completed.

When an anodic oxide film is formed around a wiring or an electrode made of aluminum or a wiring or an electrode containing mainly aluminum in an anodization process, an anodic oxide is not selectively formed on a portion of the wiring or the electrode, so that a contact for the wiring or the electrode can be formed easily in a later process.

That is, without removing a film (anodic oxide film) containing aluminum oxide or mainly aluminum oxide which is not etched (removed) easily, a contact hole can be formed, and an element and a semiconductor integrated circuit can be formed in a further stable producing process. Thus, a yield of a thin film semiconductor device and a semiconductor integrated circuit can be improved.

What is claimed is:

1. A method for producing a semiconductor device comprising the steps of:

forming a wiring or an electrode comprising an anodizable material;

selectively forming a mask on only a portion of the wiring or the electrode;

forming an anodic oxide film on a surface of the wiring or the electrode other than the portion on which the mask is formed, by anodizing the wiring or the electrode;

forming an interlayer insulating film comprising silicon oxide to cover the wiring or the electrode after the forming of said anodic oxide film; and forming a contact hole through said interlayer insulating film by etching with an etchant including hydrofluoric acid whereby said portion of the wiring or the electrode is exposed within said contact hole.

2. The method of claim 1 wherein said etchant is added with at least one acetic acid and a surface-active agent.

3. A method for producing a semiconductor device comprising the steps of:

forming an insulating film on a semiconductor;

forming a wiring or an electrode comprising an anodizable material on the insulating film;

selectively forming a mask on only a portion of the wiring or the electrode leaving another portion without said mask thereon;

forming an anodic oxide film on said another portion of the wiring or the electrode other than the portion on which the mask is formed, by anodizing another portion of the wiring or the electrode;

removing the mask after the anodizing step to expose said portion of the wiring or the electrode; forming another insulating film to cover the wiring or the electrode after the removing step; and simultaneously forming a first contact hole for the semiconductor and a second contact hole for the wiring or the electrode through said another insulating film, wherein said portion of the wiring or the electrode is exposed within said second contact hole.

4. A method for producing a semiconductor device comprising the steps of:

forming a gate insulating film on a semiconductor region;

forming a gate electrode comprising aluminum on the gate insulating film;

forming a mask on a portion of an upper surface of the gate electrode;

anodizing the gate electrode to form an anodic oxide layer around the gate electrode;

removing the mask after the anodizing step;

forming source and drain regions in the semiconductor region;

forming an insulating film to cover the gate electrode and the semiconductor region; and forming contact holes for the source and drain regions and a contact hole for the gate electrode by etching using a desired etchant.

5. The method of claim 4 wherein the anodic oxide layer is formed on a surface of the gate electrode other than the portion of the upper surface of the gate electrode.

6. The method of claim 4 wherein the portion of the upper surface of the gate electrode is in contact with the insulating film.

7. The method of claim 4 wherein the contact hole for the gate electrode is formed in the portion of the upper surface of the gate electrode.

8. A method for producing a semiconductor device comprising the steps of:

forming a gate insulating film on a semiconductor region;

forming a gate electrode comprising aluminum on the gate insulating film;

anodizing the gate electrode to form a first anodic oxide layer on an upper surface of the gate electrode;

anodizing the gate electrode to form a second anodic oxide layer on side surfaces of the gate electrode after the anodizing step;

forming source and drain regions in the semiconductor region using the gate electrode and the second anodic oxide layer as masks;

removing the second anodic oxide layer and a portion of the first anodic oxide layer after forming the source and drain regions;

forming a mask on a portion of a surface of the first anodic oxide layer after the removing step;

anodizing the gate electrode to form a third anodic oxide layer around the gate electrode;

removing the mask after forming the third anodic oxide layer;

forming lightly doped drain regions using the gate electrode and the third anodic oxide film as masks;

forming an insulating film to cover the gate electrode and the gate insulating film; and forming contact holes for the source and drain regions and a contact hole for the gate electrode by etching using a desired etchant.

9. The method of claim 8 wherein the third anodic oxide layer is formed on a surface of the gate electrode other than a portion of an upper surface of the gate electrode.

10. A method for producing a semiconductor device comprising the steps of:

forming a gate insulating film on a semiconductor region;

forming a gate electrode comprising aluminum on the gate insulating film;

forming a mask on only a portion of an upper surface of the gate electrode;

anodizing the gate electrode to form an anodic oxide layer around the gate electrode;

removing the mask after the anodizing step;

forming source and drain regions in the semiconductor region;

forming an insulating film to cover the gate electrode and the semiconductor region; and forming contact holes for the source and drain regions and a contact hole for the gate electrode by etching using a desired etchant.

11. The method of claim 8 wherein the contact hole for the gate electrode is formed in a portion of an upper surface of the gate electrode.

12. A method according to claim 1 wherein said anodizable material is aluminum.

13. A method according to claim 1 further comprising a step of forming a second wiring on said interlayer insulating film so as to be electrically connected to said electrode or the wiring through said contact hole.

14. A method according to claim 1 wherein said anodizable material is aluminum.

15. A method of manufacturing a semiconductor device comprising:

forming a semiconductor layer over a substrate;

forming a gate insulating film on said semiconductor layer;

forming a conductive film comprising an anodizable material over said semiconductor layer and said gate insulating film;

patterning said conductive film into a gate electrode by using a first mask, said gate electrode being located over said semiconductor layer with said gate insulating film interposed therebetween;

anodically oxidizing only side surfaces of said gate electrode by using said first mask in order to form a first anodic oxide film adjacent to sidewalls of said gate electrode wherein said first anodic oxide film is used to define source and drain regions within said semiconductor layer;

forming a second mask on only a selected portion of said gate electrode after the formation of said first anodic oxide film;

anodically oxidizing surfaces of said gate electrode to form a second anodic oxide film, wherein said selected portion is prevented from being oxidized by said second mask;

forming an interlayer insulating film over said semiconductor layer and said gate electrode after the forming of said second anodic oxide film;

forming at least one contact hole through said interlayer insulating film in correspondence with said selected portion of the gate electrode; and forming a wiring on said interlayer insulating film, said wiring electrically connected to said selected portion of the gate electrode through said contact hole.

16. A method according to claim 15 wherein said anodizable material is aluminum.

17. A method according to claim 15 further comprising introducing impurity ions into said semiconductor layer to form said source and drain regions in a self-aligning manner with respect to said first anodic oxide film.

18. A method according to claim 15 wherein said first anodic oxide film is removed before the forming of said second anodic oxide film.

19. A method according to claim 15 further comprising introducing impurity ions into said semiconductor layer with said second anodic oxide film and the gate electrode used as a mask.

20. A method of manufacturing a semiconductor device comprising:

forming a semiconductor layer over a substrate;

forming a gate insulating film on said semiconductor layer;

forming a conductive film comprising an anodizable material over said semiconductor layer and said gate insulating film;

oxidizing an entire upper surface of said conductive film to form an oxide insulating film;

forming a first mask on said oxide insulating film;

patterning said conductive film into a gate electrode by using said first mask, said gate electrode being located over said semiconductor layer with said gate insulating film interposed therebetween;

anodically oxidizing only side surfaces of said gate electrode by using said first mask in order to form a first anodic oxide film adjacent to sidewalls of said gate electrode wherein said first anodic oxide film is used to define source and drain regions within said semiconductor layer;

forming a second mask on only a selected portion of said gate electrode after the formation of said first anodic oxide film;

anodically oxidizing surfaces of said gate electrode to form a second anodic oxide film, wherein said selected portion is prevented from being oxidized by said second mask;

forming an interlayer insulating film over said semiconductor layer and said gate electrode after the formation of said second anodic oxide film;

forming at least one contact hole through said interlayer insulating film and said oxide insulating film to expose said selected portion of the gate electrode; and forming a wiring on said interlayer insulating film, said wiring electrically connected to said selected portion of the gate electrode through said contact hole.

21. A method according to claim 20 wherein said oxide insulating film is formed by anodically oxidizing the upper surface of said conductive film.

22. A method according to claim 21 wherein said oxide insulating film is between 100 and 150 Å thick.

23. A method according to claim 21 wherein said anodizable material is aluminum.

* * * * *